United States Patent
Hashimoto et al.

(10) Patent No.: US 9,071,779 B2
(45) Date of Patent: Jun. 30, 2015

(54) PHOTOELECTRIC CONVERSION APPARATUS AND IMAGE PICKUP SYSTEM

(71) Applicant: CANON KABUSHIKI KAISHA, Tokyo (JP)

(72) Inventors: Seiji Hashimoto, Yokohama (JP); Takeru Suzuki, Kawasaki (JP); Yasushi Matsuno, Fujisawa (JP); Takashi Muto, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 7 days.

(21) Appl. No.: 13/797,064

(22) Filed: Mar. 12, 2013

(65) Prior Publication Data

US 2013/0258132 A1 Oct. 3, 2013

(30) Foreign Application Priority Data

Mar. 30, 2012 (JP) ................................ 2012-082374
Jan. 17, 2013 (JP) ................................ 2013-006147

(51) Int. Cl.

| H04N 5/228 | (2006.01) |
|---|---|
| H04N 5/217 | (2011.01) |
| H04N 3/14 | (2006.01) |
| H03M 1/12 | (2006.01) |
| H03M 1/56 | (2006.01) |
| H04N 5/335 | (2011.01) |
| H03M 1/06 | (2006.01) |
| H04N 5/225 | (2006.01) |
| H03M 1/18 | (2006.01) |

(52) U.S. Cl.
CPC ............... *H04N 5/3355* (2013.01); *H03M 1/06* (2013.01); *H03M 1/123* (2013.01); *H03M 1/186* (2013.01); *H03M 1/56* (2013.01); *H04N 5/225* (2013.01)

(58) Field of Classification Search
CPC ........ H04N 5/3355; H04N 5/225; G03M 1/06
USPC ........ 348/222.1, 241, 294; 341/155, 164, 169
See application file for complete search history.

(56) References Cited

U.S. PATENT DOCUMENTS

| 8,063,960 | B2 * | 11/2011 | Sakai et al. | .................... 348/308 |
| 2008/0136948 | A1 * | 6/2008 | Muramatsu | .................... 348/294 |
| 2008/0192127 | A1 * | 8/2008 | Sakai et al. | ................. 348/222.1 |
| 2011/0141324 | A1 * | 6/2011 | Koseki | .......................... 348/241 |
| 2011/0221942 | A1 * | 9/2011 | Taura | ............................. 348/294 |

FOREIGN PATENT DOCUMENTS

JP 2007-281987 A 10/2007

* cited by examiner

*Primary Examiner* — Nhan T Tran
(74) *Attorney, Agent, or Firm* — Canon USA, Inc. IP Division

(57) ABSTRACT

A photoelectric conversion apparatus includes a plurality of pixels provided in a plurality of columns, a plurality of analog-to-digital conversion units each provided for a corresponding one of the plurality of columns, and a correction unit. Each of the plurality of analog-to-digital conversion units is configured to convert a signal of a corresponding one of the plurality of pixels into a digital signal at a resolution corresponding to a magnitude of the signal. The correction unit is configured to correct a difference in the resolution.

13 Claims, 8 Drawing Sheets

COUNTER CIRCUIT

COUNTER DATA IMAGE FOR VH

COUNTER DATA IMAGE FOR VL

CORRECTION OF V(L)

CORRECTION OF V(H)

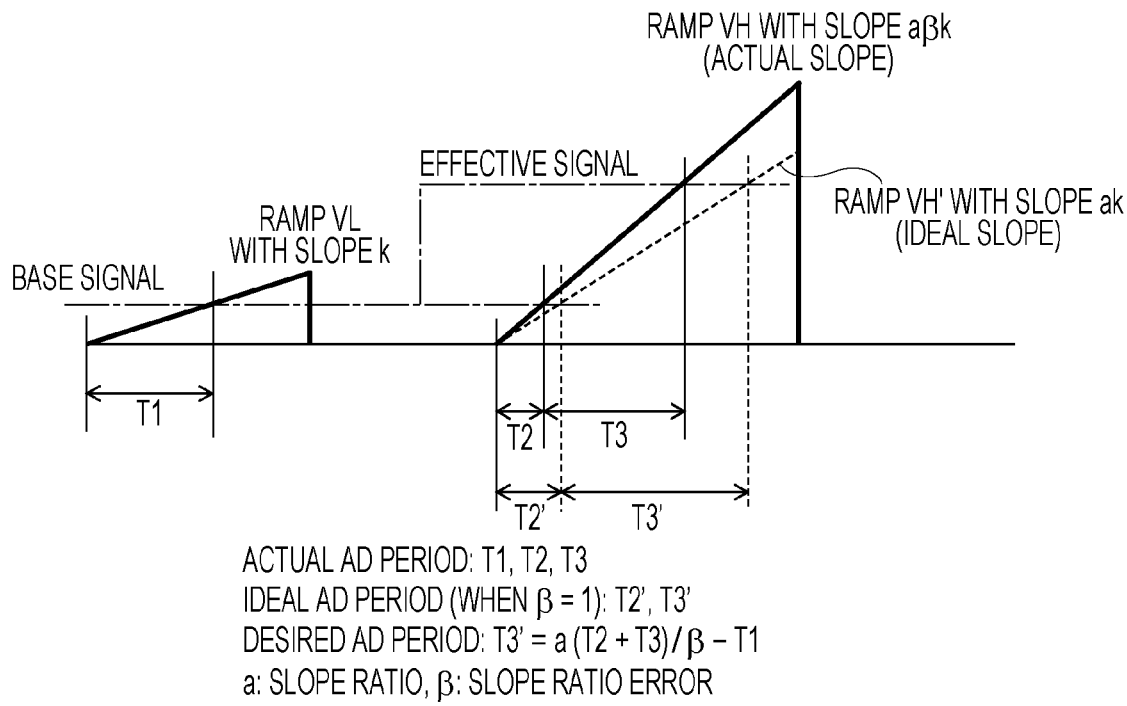
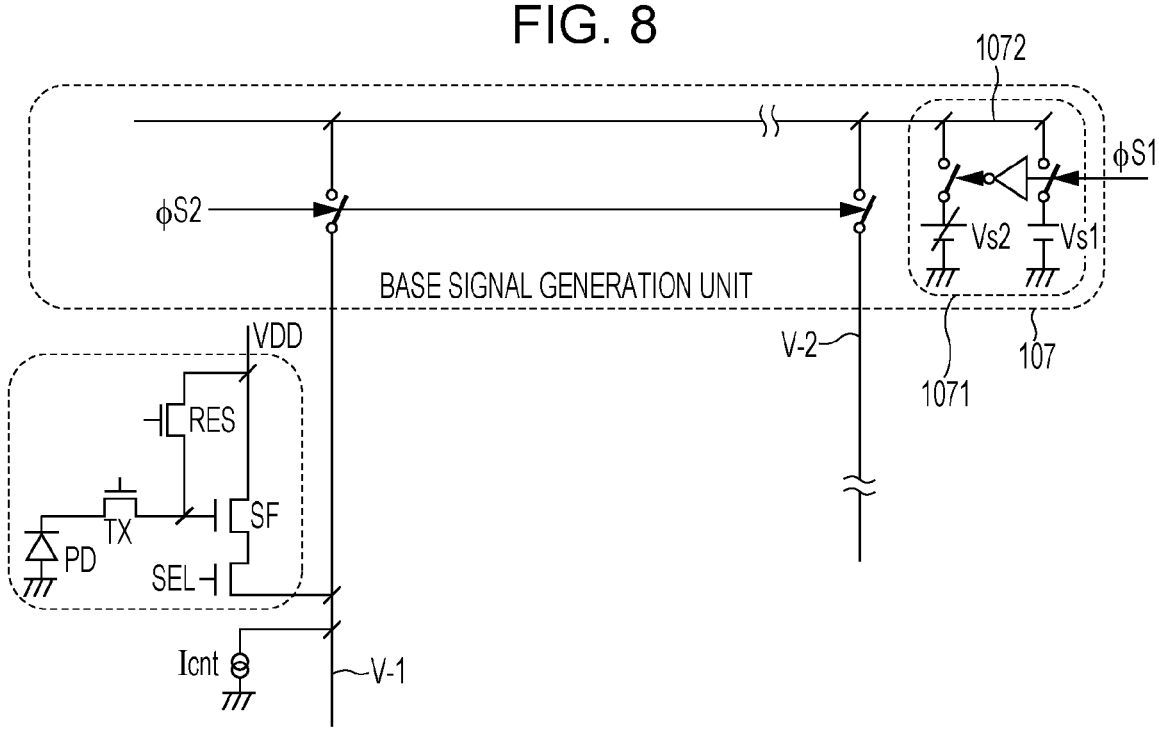

PHOTOELECTRIC CONVERSION APPARATUS AND IMAGE PICKUP SYSTEM

BACKGROUND OF THE INVENTION

1. Field of the Invention

One disclosed aspect of the embodiments relates to photoelectric conversion apparatuses and image pickup systems and, more particularly, to a photoelectric conversion apparatus including analog-to-digital (AD) converters and an image pickup system including AD converters.

2. Description of the Related Art

Image pickup apparatuses including AD converters are known. Among these image pickup apparatuses, a solid-state image pickup apparatus that uses a plurality of comparators to compare an image signal obtained from each pixel with reference signals that differently change over time and ultimately to obtain a digital signal is described in Japanese Patent Laid-Open No. 2007-281987. In this manner, an output with a high bit precision is obtained in a required range.

In the technique described in Japanese Patent Laid-Open No. 2007-281987, the linearity between an analog signal and a digital signal obtained from the analog signal is not sufficiently discussed. Specifically, in Japanese Patent Laid-Open No. 2007-281987, a difference between slopes (i.e., rates of change with respect to time) of reference signals RAMP1 and RAMP2 respectively supplied to two comparators are set to be equal to an exponential multiple of 2. However, the difference possibly becomes unequal to an exponential multiple of 2 because of, for example, variations in characteristics of a digital-to-analog converter (DAC) that generates the reference signals.

SUMMARY OF THE INVENTION

One disclosed aspect of the embodiments provides a photoelectric conversion apparatus including a plurality of pixels provided in a plurality of columns, a plurality of analog-to-digital conversion units each provided for a corresponding one of the plurality of columns, and a correction unit. Each of the plurality of analog-to-digital conversion units is configured to convert a signal of a corresponding one of the plurality of pixels into a digital signal at a resolution corresponding to a magnitude of the signal. The correction unit is configured to correct a difference in the resolution.

Further features of the disclosure will become apparent from the following description of exemplary embodiments with reference to the attached drawings.

BRIEF DESCRIPTION OF THE DRAWINGS

FIG. 7 is a diagram describing an error between slopes.

FIG. 8 is a diagram illustrating the configuration of the image pickup element according to the first exemplary embodiment.

DESCRIPTION OF THE EMBODIMENTS

One disclosed aspect of the embodiments aims to improve the linearity between an analog signal and a digital signal.

First Exemplary Embodiment

Figure 1:
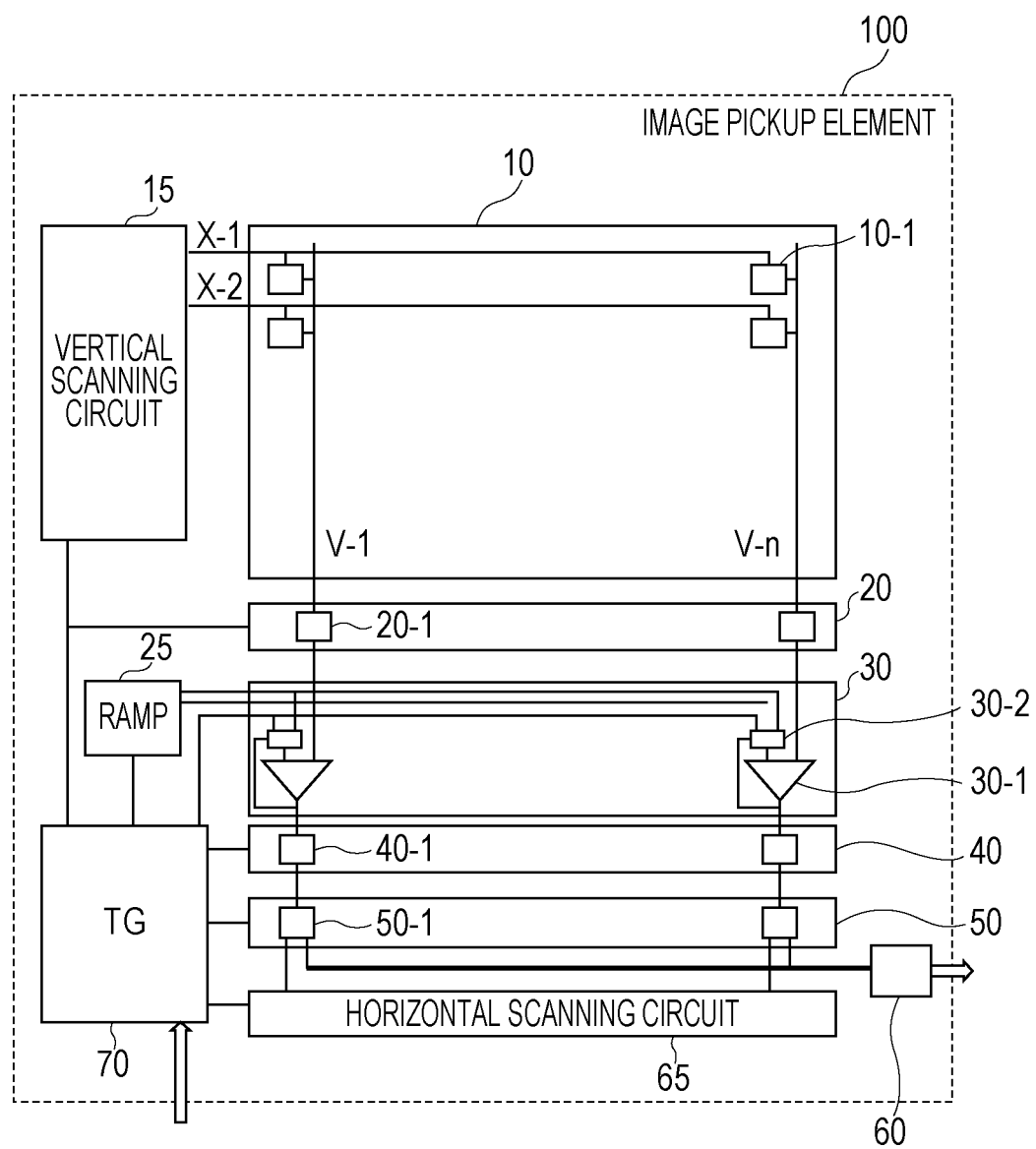
FIG. 1 is a diagram illustrating a configuration of an image pickup element according to a first exemplary embodiment.

FIG. 1 is a diagram illustrating a schematic configuration of an image pickup element 100 according to a first exemplary embodiment. The image pickup element 100, which serves as a photoelectric conversion apparatus, performs photoelectric conversion on a received optical image of a subject and outputs the resultant electric signal as a digital signal. The image pickup element 100 includes a pixel unit 10, a vertical scanning circuit 15, an amplifier unit 20, a ramp signal generation circuit (a reference signal generation unit) 25, a comparator unit 30, a counter unit 40, a memory unit 50, an output circuit 60, a horizontal scanning circuit 65, and a timing generation circuit (TG) 70 that has a function of a control unit. The comparator unit 30 and the counter unit 40 constitute AD conversion units. The pixel unit 10 includes a plurality of pixels 10-1 that is arranged in a two-dimensional matrix shape. Each pixel 10-1 generates a pixel signal through photoelectric conversion. The vertical scanning circuit 15 outputs driving pulses X-1, X-2, and so forth to the pixel unit 10. The amplifier unit 20 amplifies the pixel signals supplied from the pixel unit 10. The ramp signal generation circuit 25 generates ramp signals (reference signals) that change over time, as comparison signals to be compared with the pixel signals. The comparator unit 30 compares each pixel signal amplified by the amplifier unit 20 with the ramp signals. The counter unit 40 performs counting until the comparator unit 30 outputs the comparison result. The memory unit (a correction unit) 50 holds therein count data obtained by the counter unit 40 and performs bit shift and other calculations on the data held therein. The horizontal scanning circuit 65 performs horizontal scan so as to transfer the data from the memory unit 50 to the output circuit 60. The timing generation circuit 70 controls timings of the individual circuit blocks described above.

The plurality of pixels 10-1 is arranged in the pixel unit 10 but FIG. 1 illustrates only four pixels for simplicity. Rows of the pixels 10-1 are sequentially driven in accordance with the driving pulses X-1, X-2, and so forth supplied from the vertical scanning circuit 15. A base signal (a reset signal) of each pixel 10-1 obtained when the pixel 10-1 is in a reset state and an effective signal (a photoelectric conversion signal) of the pixel 10-1 obtained when the pixel 10-1 is in a non-reset state are led to the amplifier unit 20 via a corresponding one of vertical output lines V-1 to V-n. In the amplifier unit 20, the comparator unit 30, the counter unit 40, and the memory unit 50, circuits are provided for each of the vertical output lines V-1 to V-n. The amplifier unit 20 includes amplifier circuits 20-1, each of which may have a function of amplifying a signal output from the pixel 10-1 alone or may have this amplification function and a correlated double sampling (CDS) function for reducing noise by subtracting the base signal from the effective signal. The influence of noise generated in the comparator unit 30 may be reduced by performing amplification in the amplifier unit 20. In the case where the amplifier unit 20 does not have the CDS function, the CDS may be performed at an input stage of the comparator unit 30.

The comparator unit 30 includes comparator circuits 30-1 provided for the individual pixel columns extending from the amplifier unit 20, and selector circuits 30-2 each selecting one ramp signal from among a plurality of ramp signals. The comparator unit 30 compares the base signal supplied from the amplifier circuit 20-1 with a ramp signal having a small rate of change with respect to time, and then determines whether or not a level of the effective signal is higher than a comparison voltage, which corresponds to a comparison level. In accordance with the determination result, the comparator unit 30 selects a ramp signal to be compared with the effective signal and performs comparison. The comparison voltage mentioned above is set while taking the signal-to-noise (SN) ratio of the effective signal into account. The counter unit 40 performs a conversion operation twice for each pixel. In the first conversion operation, the comparator unit 30 compares the base signal with a ramp signal having a small rate of change with respect to time and the counter unit 40 counts down for a period from the rise of the ramp signal until the inversion of an output signal of the comparator unit 30. The base signal is, for example, a signal output when the input of the amplifier unit 20 is reset or a signal output when the output of the pixel 10-1 is reset if the amplifier unit 20 is omitted. In the second conversion operation, if the level of the effective signal is higher than the comparison voltage, the comparator unit 30 compares the effective signal with a ramp signal having a large rate of change with respect to time and the counter unit 40 corrects a ratio between resolutions achieved by the ramp signals having small and large rates of change with respect to time and counts up. The resultant multiple-bit AD conversion data is held in a corresponding one of memory circuits 50-1 included in the memory unit 50. The effective signal is, for example, a signal obtained as a result of the amplifier unit 20 amplifying a signal obtained by the pixel 10-1 through photoelectric conversion or a signal output from the pixel 10-1 when the amplifier unit 20 is omitted. Following the counting down for the base signal, if the level of the effective signal is lower than the comparison voltage, the comparator unit 30 compares the effective signal with a ramp signal having a small rate of change with respect to time and the counter unit 40 counts up. The result is held in the memory circuit 50-1 of the memory unit 50 as AD conversion data. The AD conversion data held in the memory circuit 50-1 is transferred to the output circuit 60 in accordance with scanning pulses supplied from the horizontal scanning circuit 65. The memory circuit 50-1 may include a flag memory that holds a flag signal. Also, the output circuit 60 may have a function of performing correction on the signal transferred from the memory circuit 50-1.

As described above, the image pickup element 100 compares the base signal with a ramp signal having a small rate of change with respect to time regardless of the level of the effective signal. Thus, the image pickup element 100 may acquire a high-resolution AD conversion data of the base signal. Because the AD conversion data of the base signal is subtracted from the AD conversion data of the effective signal, a high-precision AD conversion data composed of a large number of bits is consequently obtained. Also, each comparator circuit 30-1 compares the effective signal with a ramp signal selected in accordance with the level of the effective signal. This enables AD conversion using a smaller number of bits and consequently speeds up the AD conversion.

Figure 2A:
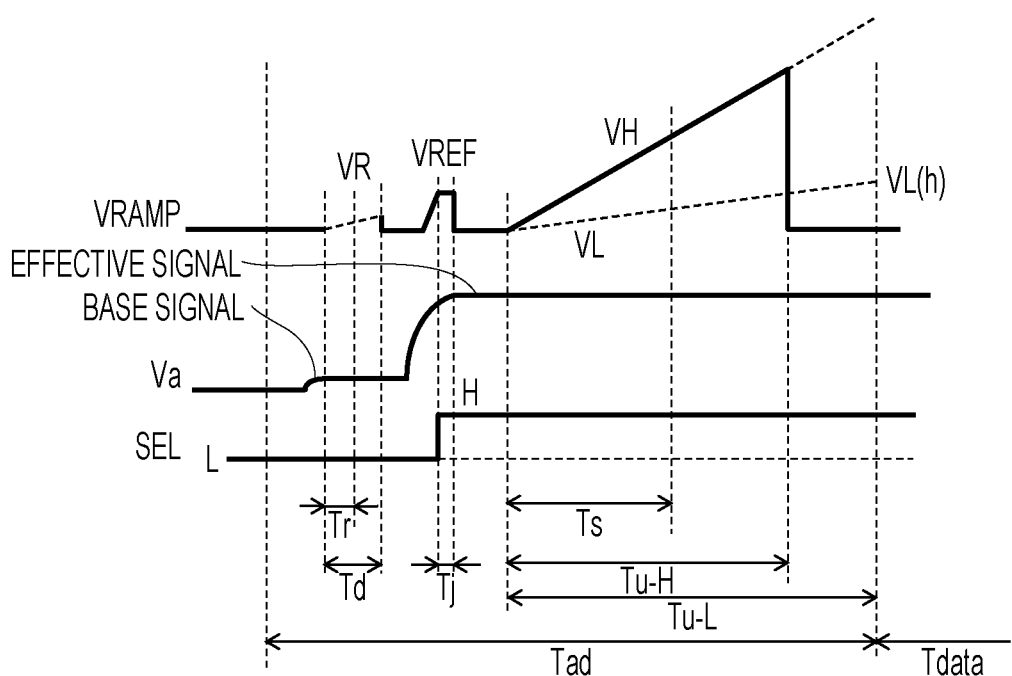
FIGS. 2A and 2B are timing charts illustrating an operation according to the first exemplary embodiment.

FIG. 2A is a timing chart illustrating a driving method of the image pickup element 100 according to the first exemplary embodiment.

Referring to FIG. 2A, a period Tad is an AD conversion period in which AD conversion is performed on the base signal and the effective signal of an analog signal Va input to the comparator circuit 30-1. A period Tdata is a transfer period in which AD conversion data is transferred. In the period Tad, a period Td is an AD conversion period in which AD conversion is performed on the base signal supplied from the pixel 10-1. The comparison signal used in this AD conversion is a ramp signal for the base signal (hereinafter, referred to as a base-signal ramp signal and corresponding to a base-signal reference signal) VR. In the period Tad, a period Tj is a signal level determination period in which the level of the effective signal is determined. The comparison signal used in this signal level determination is a comparison voltage VREF. Also, a period Tu is an AD conversion period in which AD conversion is performed on the effective signal. The comparison signal used in this AD conversion is a ramp signal for the effective signal (hereinafter, referred to as an effective-signal ramp signal and corresponding to an effective-signal reference signal) VH or VL. The signal Va output from the amplifier circuit 20-1, which serves as the base signal and the effective signal as illustrated in FIG. 2A, is led to an input terminal of the comparator circuit 30-1. A ramp signal VRAMP, which is the comparison signal of the signal Va, is input to the other input terminal of the comparator circuit 30-1. Here, the base signal is, for example, a signal output as a result of resetting the input of the amplifier circuit 20-1 when a CDS circuit is provided on the upstream side of the comparator unit 30. On the other hand, when no CDS circuit is provided, the base signal is, for example, a signal output to a vertical signal line in response to resetting a floating diffusion portion. Similarly, the effective signal is, for example, a signal having undergone noise reduction when a CDS circuit is provided on the upstream side of the comparator unit 30. On the other hand, when no CDS circuit is provided, the effective signal is, for example, a signal output to the vertical signal line as a result of transferring signal charges generated by a photodiode to the floating diffusion portion. The ramp signal generation circuit 25 is controlled in accordance with a control signal CNT2 output from the timing generation circuit 70 to generate the ramp signal VH/the comparison voltage VREF and the ramp signal VL/the ramp signal VR. The ramp signal VH is a ramp signal for more significant bits and has a large slope, whereas the ramp signal VL is a ramp signal for less significant bits and has a small slope. Also, the comparison voltage VREF is a comparison reference signal used for determining the level of the effective signal, whereas the base-signal ramp signal VR is a ramp signal to be compared with the base signal. These four ramp signals are selected by the selector circuit 30-2, which is controlled in accordance with a control signal CNT1 output from the timing generation circuit 70, and the selected ramp signal is input to the comparator circuit 30-1. The timing generation circuit 70 controls the ramp signal generation circuit 25 by using the control signal CNT2.

The comparison voltage VREF will be described next. The comparison voltage VREF may be generated in another power supply circuit or in the ramp signal generation circuit 25. The ramp signal generation circuit 25 may generate the comparison voltage VREF by stopping a charging current in generation (e.g., at approximately 60 mV) as in formation of the ramp signal VH. Generation of the comparison voltage VREF takes a period that is 1/16 of a period taken to generate the ramp signal VH. To further shorten this period, the charging current may be increased. Also, the comparison voltage VREF needs to be lower than 67 mV, which is a voltage VL(H) ultimately reached by the ramp signal VL. By keeping the comparison voltage VREF lower in this manner, the effective signal may be compared with the ramp signal VH or the ramp signal VL.

The comparator circuit 30-1 compares the base signal with the base-signal ramp signal VR during the AD conversion period Td of the base signal. Here, let Tr represent a period from when the base-signal ramp signal VR starts changing to when a relationship between magnitudes of the base-signal ramp signal VR and the base signal inverts. A counter circuit 40-1 counts down during this period Tr. The memory circuit 50-1 holds therein the down-counted value (a first count value) as base-signal digital data. The base-signal ramp signal VR has substantially the same slope as the ramp signal VL. By making the base-signal ramp signal VR and the ramp signal VL have substantially the same slope, the base-signal digital data with a high resolution may be obtained. Subsequently, during the signal level determination period Tj, the comparator circuit 30-1 compares the effective signal with the comparison voltage VREF. In the example illustrated in FIG. 2A, in the signal level determination period Tj, the comparator circuit 30-1 outputs, to the selector circuit 30-2, a selection signal SEL of high level, which indicates that the effective signal is higher than the comparison voltage VREF. As a result, during the AD conversion period Tu of the effective signal, the selector circuit 30-2 selects the ramp signal VH with a large slope and outputs the ramp signal VH to the comparator circuit 30-1. The comparator circuit 30-1 compares the effective signal with the ramp signal VH. Here, let Ts represent a period to when the relationship between magnitudes of the effective signal and the ramp signal VH inverts. During this period Ts, the counter circuit 40-1 counts up, subsequent to counting down for the base signal. The memory circuit 50-1 holds therein the up-counted value (a second count value) as effective-signal digital data. If the output of the comparator circuit 30-1 does not invert within the signal level determination period Tj, the selection signal SEL remains low, which indicates that the level of the effective signal is lower than the comparison voltage VREF. Accordingly, the selector circuit 30-2 selects the ramp signal VL with a small slope. In this case, the comparator circuit 30-1 compares the effective signal with the ramp signal VL. Based on the level of the effective signal amplified by the amplifier unit 20, the selector circuit 30-2 selects one of the ramp signals VH and VL having different slopes. That is, based on the level of the effective signal obtained from the pixel 10-1, the selector circuit 30-2 sets a rate of change of the ramp signal with respect to time. The comparator circuit 30-1 compares the ramp signal selected by the selector circuit 30-2 with the effective signal amplified by the amplifier unit 20. The counter circuit 40-1 counts up for a period from when the ramp signal starts changing to when the comparator circuit 30-1 outputs a signal which indicates that the relationship between magnitudes of the effective signal and the ramp signal has inverted.

Referring to FIG. 2A, the base-signal ramp signal VR and the ramp signal VL have substantially the same slope as described before. The base-signal ramp signal VR is compared with the base signal. Because the base signal serves as a base signal for the effective signal, the base signal desirably has a high precision. The base-signal ramp signal VR has substantially the same slope as the ramp signal VL with which less significant bits are generated. This beneficially allows the use of the same ramp signal generation circuit 25. Functions of the counter circuit 40-1 in a down-counting mode and in an up-counting mode will be described later with reference to FIGS. 3A to 3C.

A gain of the amplifier circuit 20-1 may be set in accordance with an image pickup environment. For example, in the case where the speed rating setting is ×16, the signal level of 62.5 mV is amplified to 1 V and the amplified signal is input to the comparator circuit 30-1. The SN ratio required in AD conversion at this time is sufficiently achieved by a resolution of 10-bit AD conversion in which a high-amplitude signal is compared with the ramp signal VH. Accordingly, when the speed rating setting is ×16 or higher, the selector circuit 30-2 may be controlled in accordance with the control signal CNT1 supplied from the timing generation circuit 70 to select the ramp signal VH and to output the ramp signal VH to the comparator circuit 30-1. Because the SN ratio of the pixel unit 10 is greatly affected by the area of an opening of the pixel unit 10, a ratio between slopes of the ramp signal VH and the ramp signal VL and the speed rating setting for selecting the ramp signal VH change depending on the area of the opening.

Figure 2B:
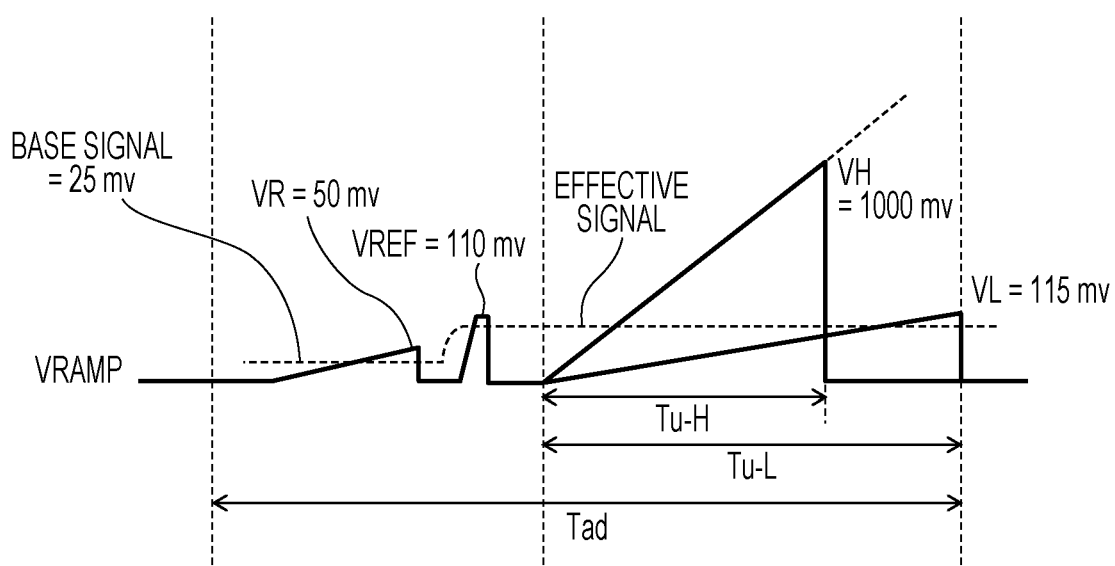

An example of how to determine the amplitude of the ramp signal VR and the value of the comparison voltage VREF will be described next. FIG. 2B illustrates the ramp signal VRAMP and the output signal Va of the amplifier circuit 20-1 for the period Tad illustrated in FIG. 2A so that the ramp signal VRAMP and the output signal Va overlap one another. Suppose that the maximum value of the ramp signal VH, namely, the amplitude thereof, is 1000 mV. In this case, an analog signal with a signal level of 1000 mV or lower may be converted into digital values.

The amplitude of the ramp signal VR needs to be set to a value that is larger than the maximum amplitude of the base signal input to the comparator circuit 30-1. Herein, the amplitude of the ramp signal VR is set to 50 mV.

In the case where the slope of the ramp signal VH is 16 times larger than that of the ramp signal VL, the ramp signal VL reaches 62.5 mV at a time when the period Tu-H ends. Accordingly, the comparison voltage VREF may be ideally set to 62.5 mV in order to convert an analog signal having a signal level lower than 62.5 mV using the ramp signal VL. However, in practice, because comparator circuits have characteristic errors (variations) which serve as an offset, inconvenience possibly occurs if the comparison voltage VREF is set to 62.5 mV. For example, in the case where the comparator circuit 30-1 has an offset of 50 mV, AD conversion is performed using the ramp signal VH if the level of the effective signal is higher than 12.5 mV. That is, although the effective signal having a level lower than 62.5 mV is supposed to be converted using the ramp signal VL, AD conversion is actually performed using the ramp signal VH because of the added offset of the comparator circuit 30-1. Consequently, a desired precision is not achieved.

Accordingly, the comparison voltage VREF is set to 112.5 mV or lower in order to perform AD conversion by using the ramp signal VL when a signal having a level lower than 112.5 mV, which is obtained by adding the offset 50 mV of the comparator circuit 30-1 to the maximum signal amplitude 62.5 mV to be converted using the ramp signal VL, is input to the comparator circuit 30-1 as the effective signal. FIG. 2B illustrates a case where the comparison voltage VREF is set to 110 mV while taking into account that the ramp signal generation circuit 25 also has variations.

The amplitude of the ramp signal VL is set to a value larger than the comparison voltage VREF so that AD conversion may be performed on an analog signal having a level equal to the comparison voltage VREF or lower. Herein, the case is illustrated in which the comparison voltage VREF is 110 mV and the amplitude of the ramp signal VL is 115 mV. Because the amplitude 115 mV is larger than 1/16 of the amplitude 1000 mV of the ramp signal VH, the AD conversion period Tu-L in which the ramp signal VL is used is longer than the AD conversion period Tu-H in which the ramp signal VH is used. By setting the AD conversion period Tu-L longer than the AD conversion period Tu-H, AD conversion may be performed accurately using the ramp signal VL even if the comparator circuit 30-1 has an offset.

Figure 3A:
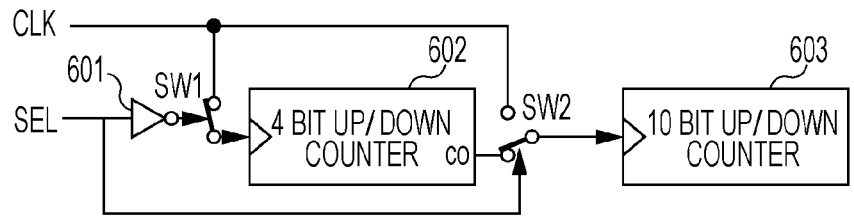
FIGS. 3A to 3C are conceptual diagrams describing bit shift performed on data obtained from AD conversion.
Figure 3B:
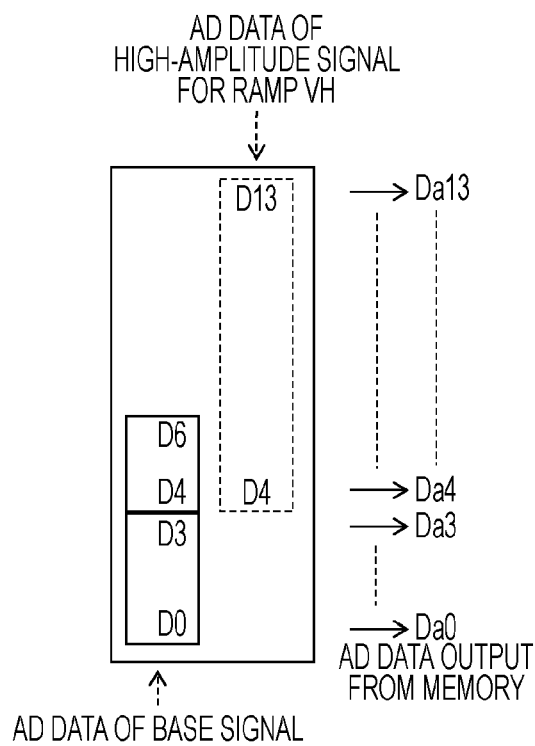
Figure 3C:
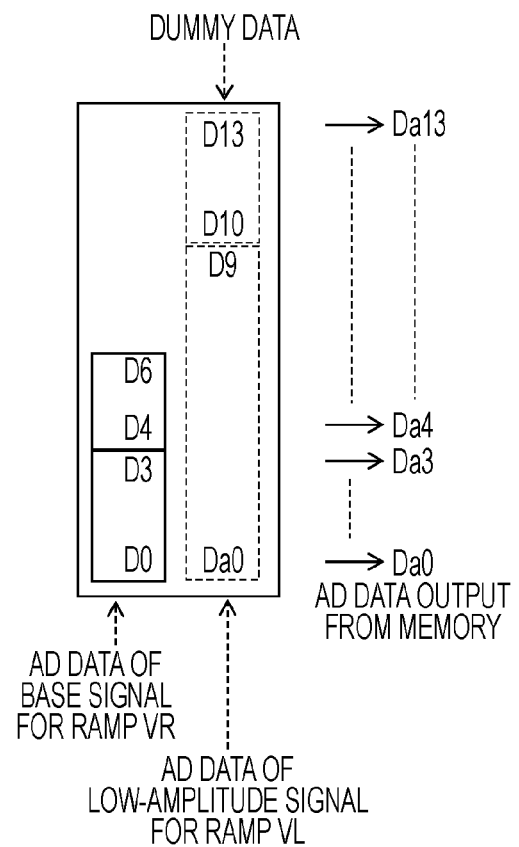

FIGS. 3A to 3C are diagrams illustrating an exemplary configuration of the counter circuit (the correction unit) 40-1. The counter circuit 40-1 counts until the output of the comparator circuit 30-1 regarding comparison between the base signal and the base-signal ramp signal VR or comparison between the effective signal and the effective-signal ramp signal VH or VL inverts. When the comparator circuit 30-1 performs comparison on the base signal, the counter circuit 40-1 counts down. In contrast, when the comparator circuit 30-1 performs comparison on the effective signal, the counter circuit 40-1 counts up. The memory unit (the correction unit) 50 performs bit shift on the count data to correct a ratio between resolutions.

FIG. 3A is a diagram illustrating an exemplary configuration of the counter circuit 40-1. FIGS. 3B and 3C are diagrams for describing a process performed by the memory unit (the correction unit) 50. Specifically, FIG. 3B is a diagram illustrating count data obtained when the base signal is compared with the base-signal ramp signal VR and thereafter the effective signal is compared with the ramp signal VH in the case where the level of the effective signal is higher than the comparison voltage VREF. FIG. 3C is a diagram illustrating count data obtained when the base signal is compared with the base-signal ramp signal VR and thereafter the effective signal is compared with the ramp signal VL in the case where the level of the effective signal is lower than the comparison voltage VREF.

The counter circuit 40-1 includes an inverter 601, a 4-bit up/down counter 602, a 10-bit up/down counter 603, a switch SW1, and a switch SW2. A counter clock signal CLK is input to the switches SW1 and SW2. The inverter 601 outputs a logically inverted signal of the selection signal SEL. The switch SW1 is controlled in accordance with an output signal of the inverter 601, whereas the switch SW2 is controlled in accordance with the selection signal SEL. The counter clock signal CLK is input to a clock terminal of the 4-bit up/down counter 602 or the 10-bit up/down counter 603 in accordance with the selection signal SEL.

Referring to FIG. 3B, a case where the level of the effective signal is higher than the comparison voltage VREF, that is, a case where the selection signal SEL indicates a high level and the comparator circuit 30-1 compares the effective signal with the ramp signal VH, will be described. In the period Tr, the selection signal SEL indicates a low level. Then, the counter clock signal CLK is input to the clock terminal of the 4-bit up/down counter 602 via the switch SW1. A carry output co of the 4-bit up/down counter 602 is output to the clock terminal of the 10-bit up/down counter 603 via the switch SW2. The 4-bit up/down counter 602 counts down in synchronization with the counter clock signal CLK and outputs data bits D0 to D3. The 10-bit up/down counter 603 counts down in synchronization with the carry output co of the 4-bit up/down counter 602 and outputs data bits D4 to D6. The down-counted value (the first count value) of the base signal is constituted by the data bits D0 to D6. Next, in the period Ts, the selection signal SEL changes to the high level. Then, the counter clock signal CLK is no longer input to the clock terminal of the 4-bit up/down counter 602 via the switch SW1. Instead, the counter clock signal CLK is output to the clock terminal of the 10-bit up/down counter 603 via the switch SW2. The 10-bit up/down counter 603 counts up in synchronization with the counter clock signal CLK and outputs the up-counted value to the memory unit 50. The memory unit 50 shifts the up-counted value by four bits, and stores the resultant 10 data bits D4 to D13 as data bits Da4 to Da13. The memory unit 50 also stores, as data bits Da0 to Da3, the four data bits D0 to D3 output from the 4-bit up/down counter 602. The resultant data bits Da0 to Da13 represent data obtained by subtracting the base signal from the effective signal in the 4-bit up/down counter 602 and the 10-bit up/down counter 603. The 14 data bits Da0 to Da13 respectively correspond to the data bits D0 to D13 and are stored in the memory circuit 50-1. As described above, the AD conversion data bits D4 to D13 obtained from comparison of the effective signal with the ramp signal VH are shifted by four bits relative to the data bits D0 to D6 obtained from comparison of the base signal with the base-signal ramp signal VR before subtraction is performed thereon. In this way, 14-bit high-precision AD conversion data represented by the data bits Da0 to Da13 is obtained.

Referring to FIG. 3C, a case where the level of the effective signal is lower than the comparison voltage VREF, that is, a case where the selection signal SEL indicates the low level and the comparator circuit 30-1 compares the effective signal with the ramp signal VL, will be described. As in FIG. 3B, during the period Tr, the counter circuit 40-1 counts down for the base signal. The down-counted value (the first count value) is represented by data bits D0 to D6. Subsequently, in the period Ts, the selection signal SEL indicates the low level. Then, the counter clock signal CLK is input to the clock terminal of the 4-bit up/down counter 602 via the switch SW1. The carry output co of the 4-bit up/down counter 602 is output to the clock terminal of the 10-bit up/down counter 603 via the switch SW2. The 4-bit up/down counter 602 counts up in synchronization with the counter clock signal CLK. The 10-bit up/down counter 603 counts up in synchronization with the carry output co of the 4-bit up/down counter 602 and outputs 10 data bits D0 to D9 to the memory unit 50. Dummy data bits D10 to D13 are "0". The data bits D0 to D9 and the dummy data bits D10 to D13 are stored in the memory unit 50 as the data bits Da0 to Da9 and the data bits Da10 to Da13, respectively. In this way, the 14 data bits Da0 to Da13 are stored in the memory unit 50. The resultant data bits Da0 to Da10 represent data obtained by subtracting the base signal from the effective signal in the 4-bit up/down counter 602 and the 10-bit up/down counter 603. The dummy data bits D11 to D13 are added as the data bits Da11 to Da13. The 14 data bits Da0 to Da13 are stored in the memory circuit 50-1. The dummy data bits D10 to D13 indicate that more significant bits are zero because the effective signal is low-amplitude data. Data obtained by AD conversion is constituted by 10 bits, namely, the data bits D4 to D13, in the case of FIG. 3B and by 11 bits, namely, the data bits D0 to D10, in the case of FIG. 3C. This is because the AD conversion period Tu-L is longer than the AD conversion period Tu-H as illustrated in FIG. 2B and a difference between the AD conversion periods appears as a difference of one data bit.

As described above, when the base signal is subtracted from the effective signal, the count data of the base signal, which results from comparison performed at a high resolution using the base-signal ramp signal VR, is used regardless of whether the effective signal is a high-amplitude signal or a low-amplitude signal. This may provide high-precision AD conversion data in which the influence of quantization noise is reduced. Also, in FIG. 3B, 14-bit AD conversion data composed of the data bits Da0 to Da13 may be obtained by using the 10 data bits D4 to D13 resulting from four bit shift.

The comparator circuit 30-1 compares the base signal of the pixel 10-1 with the base-signal ramp signal VR during the period Td and the counter circuit 40-1 counts during the period Tr to when the relationship between magnitudes of the base signal of the pixel 10-1 and the base-signal ramp signal VR inverts so as to obtain the first count value. Thereafter, the comparator circuit 30-1 compares the effective signal of the pixel 10-1 with the effective-signal ramp signal VH or VL during the period Tu and the counter circuit 40-1 counts during the period Ts to when the relationship between magnitudes of the effective signal of the pixel 10-1 and the effective-signal ramp signal VH or VL inverts so as to obtain the second count value. The correction unit constituted by the counter circuit 40-1 and the memory unit 50 corrects a difference between resolutions of the first count value and the second count value, which corresponds to a difference between rates of change of the base-signal ramp signal VR and the effective-signal ramp signal VH or VL with respect to time. Then, the memory unit (the correction unit) 50 outputs the data bits Da0 to Da13 representing the difference between the corrected first and second count values. Specifically, the memory unit (the correction unit) 50 corrects the difference between resolutions by performing bit shift on the second count value in the case of FIG. 3B.

The example has been described above in which down-counting is performed to obtain the first count value during the period Tr and up-counting is performed to obtain the second count value during the period Ts but counting may be performed in the opposite manner. Specifically, the counter circuit 40-1 may count up during the period Tr to obtain the first count value and may count down during the period Ts to obtain the second count value, whereby the data bits Da0 to Da13 representing the difference between the first count value and the second count value may be output. That is, the counter circuit 40-1 counts down or counts up to obtain the first count value and counts in a direction opposite to the counting direction of the first count value to obtain the second count value. Consequently, the memory unit (the correction unit) 50 outputs the data bits Da0 to Da13 representing the difference between the corrected first and second count values.

The example has been described above in which the subtraction is performed by the counter circuit 40-1 having functions of counting in the down-counting mode and the up-counting mode but the subtraction is not limited to this one. The counted results of the base signal and the effective signal may be stored in the memory unit 50. Subtraction may be performed on the effective signal and the base signal when the counted results are transferred from the memory unit 50 to the output circuit 60, when the counted results are output from the output circuit 60 to outside of the image pickup element 100, or in an external circuit (for example, an image signal processing circuit unit 830 illustrated in FIG. 10). At this time, flag data that indicates the signal level determined relative to the comparison voltage VREF (the selection signal SEL) is added to the AD conversion data. This makes it easier to handle any bit shifting method. The AD conversion data is output by the counter unit 40 together with the flag data that indicates the level of the effective signal.

Figure 4:
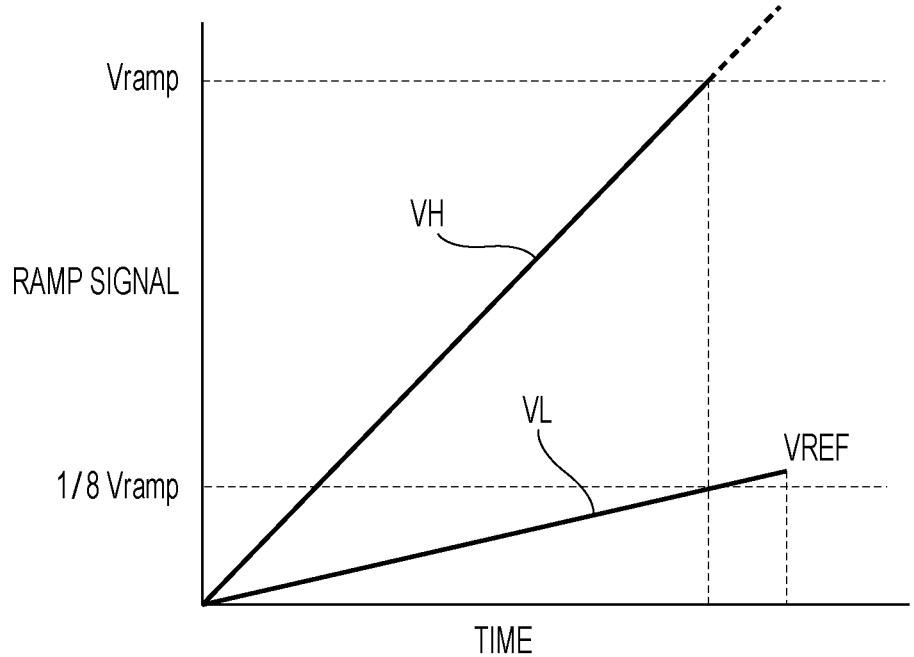
FIG. 4 is a diagram illustrating reference signals according to the first exemplary embodiment.

Next, the ramp signals VH and VL, which serve as reference signals, will be described in detail. FIG. 4 illustrates changes in the ramp signals VL and VH over the period Tu of FIGS. 2A and 2B. It is assumed that there is a difference equivalent to three bits between the case of performing conversion using the ramp signal VL and the case of performing conversion using the ramp signal VH. Thus, the slope of the ramp signal VL is set to be equal to $1/(2^3)=1/8$ of the slope of the ramp signal VH. Because an analog signal that is converted using the ramp signal VL has a low amplitude, the analog signal is affected by variations in characteristics of comparator circuits relatively largely. Thus, at signal levels around 1/8Vramp, the signal level of the signal possibly exceeds 1/8Vramp as a result of an offset component of the comparator circuit 30-1 being added to the signal level. Accordingly, the signal level of the ramp signal VL changes over a longer period than the ramp signal VH as illustrated in FIG. 4. This allows AD conversion to be performed while taking the offset component of the comparator circuit 30-1 into account. The maximum value of the ramp signal VL at this time is, for example, the comparison voltage VREF illustrated in FIGS. 2A and 2B.

Figure 5A:
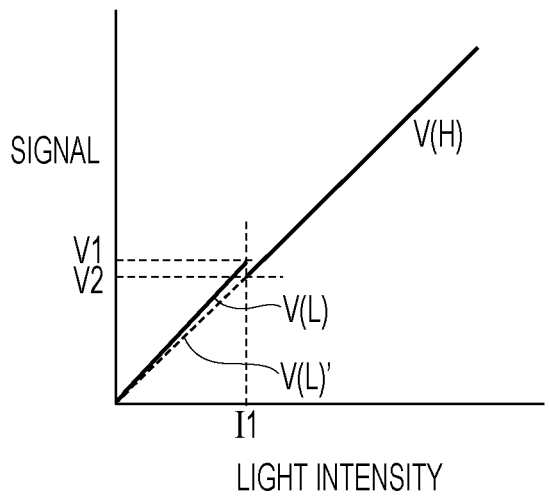
FIGS. 5A and 5B are diagrams describing the principle of an embodiment.
Figure 5B:
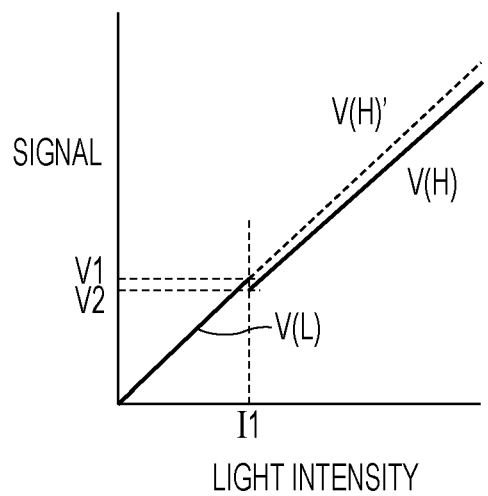

FIGS. 5A and 5B are diagrams illustrating a relationship between incident light intensity, which is represented by the horizontal axis, and digital data resulting from AD conversion, which is represented by the vertical axis. The light intensity corresponds to the analog signal Va supplied to the comparator circuit 30-1. Also, V(H) represents a signal obtained from comparison performed using the ramp signal VH, whereas V(L) represents a signal obtained from comparison performed using the ramp signal VL. A dotted line between a solid line V(H) and the signal level equal to zero is a line with an ideal slope of the signal V(L). Ideally, the digital data is linear with respect to the incident light intensity. FIG. 5A illustrates a case where conversion is performed using the ramp signal VL when the light intensity is lower than I1 and conversion is performed using the ramp signal VH when the light intensity exceeds I1. The signal voltage for the light intensity that is equal to I1 is different between data V1 obtained by performing conversion using the ramp signal VL and data V2 obtained by performing conversion using the ramp signal VH.

The reasons for this are as follows. Each of the ramp signals VL and VH generated by the ramp signal generation circuit 25 vary because of the error between the slope and the ideal slope caused by variations in production. Also, the number of pixels that use each of the ramp signals VL and VH varies depending on the signal level and a total value of parasitic capacitances of lines that transmit the signals varies. As a result, the slopes of the signals V(L) and V(H) change. Furthermore, when a ratio between the slopes of the ramp signals VL and VH is changed, the signal voltages V1 and V2 possibly differ from one another. When the signal voltages V1 and V2 differ from one another in this manner, the pixel signal level becomes discontinuous. Consequently, a luminance gap is caused in an image having a slight luminance difference. Accordingly, the linearity needs to be improved by adjusting the slope of the signal V(L) or V(H).

In addition to the slope error, errors in the offset may occur. FIG. 5B is a diagram describing the offset error. FIG. 5B illustrates a case where an ideal characteristic is shown in a region where the light intensity is lower than I1, whereas an offset that lowers the signal level relative to the ideal characteristic represented by the dotted line is caused in a region where the light intensity is higher than I1. When the offset error occurs, the linearity may be improved by adjusting the amount of offset.

A method of correcting the linearity will be described next.

Figure 6:
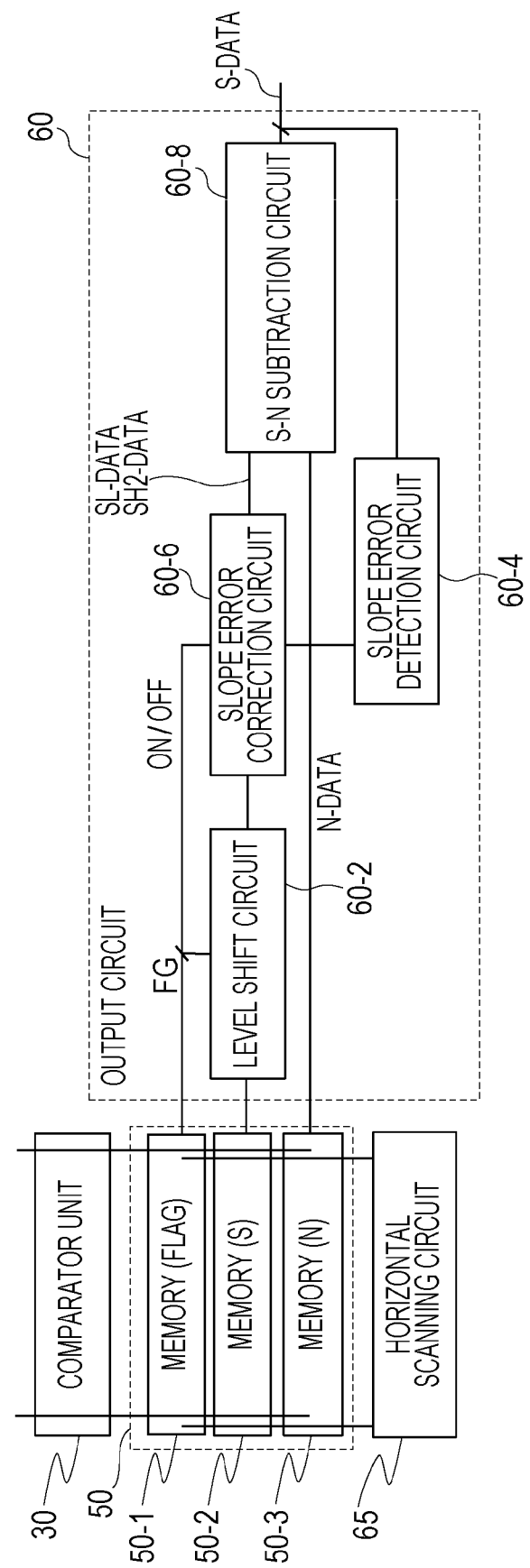
FIG. 6 is a diagram illustrating a configuration of an output circuit according to the first exemplary embodiment.

FIG. 6 is a diagram illustrating an exemplary configuration of the output circuit 60 according to the first exemplary embodiment. The output circuit 60 has functions of adjusting a ratio between slopes, detecting errors in the ratio between slopes, correcting the errors in the ratio between slopes, and subtracting base signal data from effective signal data.

The memory unit 50 includes a memory (flag) 50-1, a memory (S) 50-2, and a memory (N) 50-3. The memory (S) 50-2 holds therein digital data obtained during the AD conversion period Tu-H or Tu-L, whereas the memory (N) 50-3 holds therein digital data obtained during the AD conversion period Td. The memory (flag) 50-1 holds therein data indicating which of the ramp signals VH and VL is used to perform AD conversion on the effective signal.

The output circuit 60 includes a level shift circuit 60-2, a slope error detection circuit 60-4, a slope error correction circuit 60-6, and an S-N subtraction circuit 60-8. The level shift circuit 60-2 adjusts a ratio between the slopes of the ramp signals. The slope error detection circuit 60-4 detects an error in the slope of the ramp signal. The slope error correction circuit 60-6 corrects the error in the slope of AD conversion data. The S-N subtraction circuit 60-8 subtracts an AD conversion result (N-AD) of the base signal from an AD conversion result (S3-AD) of the effective signal having undergone correction of the slope ratio and the slope error. Processing performed by the level shift circuit 60-2 and the slope error correction circuit 60-6 is switched depending on flag data FG.

FIG. 7 is a diagram of waveforms of the ramp signals for describing the slope error.

The slope error of the digital data will be described in detail. In FIG. 7, the ramp signal VH (a solid line) denotes an actual signal to be compared with the effective signal, whereas a ramp signal VH' (a dotted line) denotes an ideal signal. Here let "k" denote a slope of the ramp signal VL to be compared with the base signal, let "a" denote a ratio between slopes of the ramp signals VH and VL, and let β denote an error in the slope of the ramp signal VH. Then, the slope of the ramp signal VH' is denoted by a·k and the slope of the ramp signal VH is denoted by a·β·k.

The pixel signal Va denoted by a dot-and-dash line is compared with the ramp signal VRAMP. Here, T1 denotes an AD conversion period of the base signal. Regarding the ideal ramp signal VH', T2' denotes an AD conversion period of the base signal and T3' denotes an AD conversion period of the effective signal. Regarding the actual ramp signal VH, T2 denotes an AD conversion period of the base signal and T3 denotes an AD conversion period of the effective signal.

In the AD conversion period in which the ideal ramp signal VH' is used, when the AD conversion period of the effective signal is multiplied by "a" in order to adjust the ratio between slopes of the base signal and the effective signal, the AD conversion period of the effective signal is denoted as a·(T2'+T3'). Because a·T2'=T1 is satisfied, the AD conversion period of the effective signal is denoted by, as a result of subtraction of the AD conversion period T1 of the base signal, $$a \cdot T3' = a \cdot (T2' + T3') - T1 \quad (1).$$

In the AD conversion period in which the actual ramp signal VH is used, proper AD conversion data of the effective signal may be obtained by adjusting the slope ratio of the actual AD conversion data, dividing the result by the slope error β, and then subtracting the base signal T1. The AD conversion period of the resultant AD conversion data is denoted by $$a \cdot (T2 + T3)/\beta - T1 = a \cdot T3' \quad (2).$$

Accordingly, in order to obtain high-precision AD conversion data, the slop error β needs to be detected. FIG. 8 illustrates a configuration of a test base signal generation unit that serves as a signal source. A test base signal generation unit 107 includes a signal generation circuit 1071. The signal generation circuit 1071 supplies a voltage Vs1 or Vs2 in accordance with a signal φS1. The signal generation circuit 1071 is connected to each vertical signal line via a switch that is driven in accordance with a signal φS2.

Figure 9:
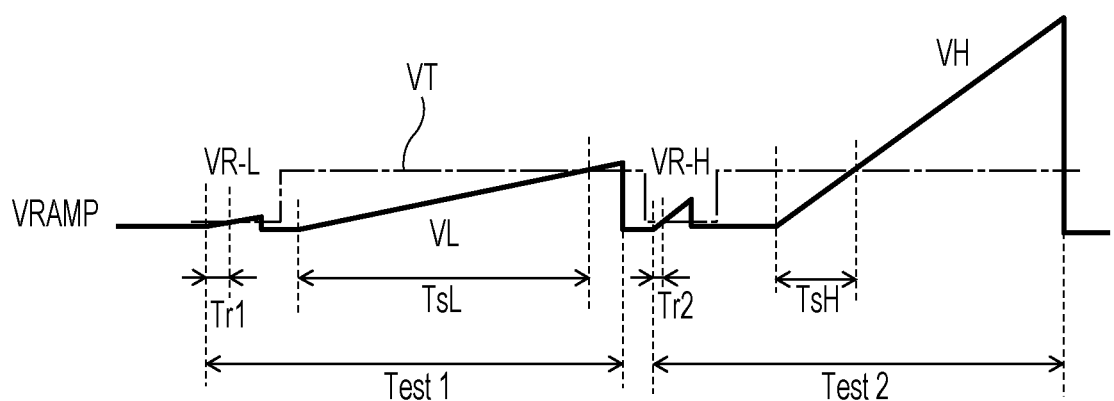
FIG. 9 is a diagram illustrating an operation according to the first exemplary embodiment.

FIG. 9 is a diagram illustrating timing for detecting a ratio between slopes of the ramp signals VL and VH.

After the signal φS2 is made high, a base signal generated by the test base signal generation unit 107 is input to the comparator circuit 30-1 as a test signal VT. The comparator circuit 30-1 compares the test signal VT with the ramp signal VRAMP. Data SL obtained by performing AD conversion using the ramp signal VL during a period TsL is held in the memory circuit 50-1. Then, data SH obtained by performing AD conversion using the ramp signal VH during a period TsH is held in the memory circuit 50-1. The pieces of data SL and SH held in the memory circuit 50-1 may be transferred to the outside concurrently or sequentially.

In order to determine an offset voltage of the comparator circuit 30-1 and ultimately cancel or at least reduce the offset voltage, illustrated ramp signal VR-L and VR-H may be input. The ramp signals VR-L and VL have substantially the same slope, whereas the ramp signals VR-H and VH have substantially the same slope. By setting each pair of ramp signals to have substantially the same slope, the offset voltage may be subtracted in the up/down counters illustrated in FIG. 3A.

Here, an example case of correcting the resolution by using the test signal VT will be briefly described. When the ratio between the slopes is 1/16, the resolution is corrected by inputting the clock signal CLK to the 4-bit up/down counter 602 when the ramp signal VL is used and by inputting the clock signal CLK to the 10-bit up/down counter 603 when the ramp signal VH is used. The image signal processing circuit unit 830 at a subsequent stage computes an error in the slope of the corrected data and stores a computed result K. Referring to the signal levels illustrated in FIGS. 5A and 5B, the computed result is denoted by K=V1/V2. The slope of the signal V(L) is corrected by multiplying the signal V(L) by 1/K. As a result, the data SL may be corrected so that the signal V(L) is connected to the signal V(H) linearly. This correction processing may reduce the luminance gap of the image to a level lower than the detection limit. The correction may be performed on the signal V(H). Correction of the difference between the resolutions is not necessary performed in the up-down counters. Data obtained by performing comparison using the ramp signal VL and the ramp signal VH may be shifted by four bits in a circuit on the subsequent stage. The same applies to the S-N subtraction processing in which subtraction is performed on signals obtained by performing conversion using the ramp signals VR-L and VR-H.

Also, the test base signal generation unit 107 may be omitted and the test signal VT may be generated by radiating uniform light to the image pickup element 100.

After the signal φS2 is made high to connect a test signal line 1072 to the vertical signal line V-1, the test signal VT is input from the test base signal generation unit 107 to the comparator circuit 30-1 via an amplifier circuit. The test signal VT has a voltage equivalent to the base signal of the pixel signal when the signal φS1 is made high and has a voltage equivalent to the effective signal when the signal φS1 is made low.

In the example illustrated in FIG. 9, during a period Test1, AD conversion data 1 (TsL−Tr1) of the effective signal is obtained by performing subtraction on pieces of AD conversion data, which result from comparison between the test signal VT and the ramp signal VR-L having a small slope and comparison between the test signal VT and the ramp signal VL. The AD conversion data 1 is held in the slope error detection circuit 60-4. Subsequently, during a period Test2, AD conversion data 2 (TsH−Tr2) of the effective signal is obtained by performing subtraction on pieces of AD conversion data, which result from comparison between the test signal VT and the ramp signal VR-H having a large slope and comparison between the test signal VT and the ramp signal VH. The AD conversion data 2 is held in the slope error detection circuit 60-4. The slope error β may be determined from the held AD conversion data 1 and AD conversion data 2 using Equation (3).

$$\beta = a \cdot (TsH - Tr2)/(TsL - Tr1) \tag{3}$$

Also, the slope error β may be determined using the test signal VT which is generated by radiating uniform light to the image pickup element 100 instead of providing the test base signal generation unit 107.

The slope error β is stored in the slope error detection circuit 60-4. AD conversion data SH1-DATA that is obtained by performing comparison using the ramp signal VH having a large slope when the image pickup element 100 is actually driven is multiplied by 1/β.

The operation described above may be performed, for example, before the image pickup element 100 is built in an image pickup system and correction data may be stored in a memory of the image pickup system. Also, by performing the operation prior to an image pickup operation, the influence of environmental conditions, such as temperature, may also be reduced.

Second Exemplary Embodiment

Figure 10:
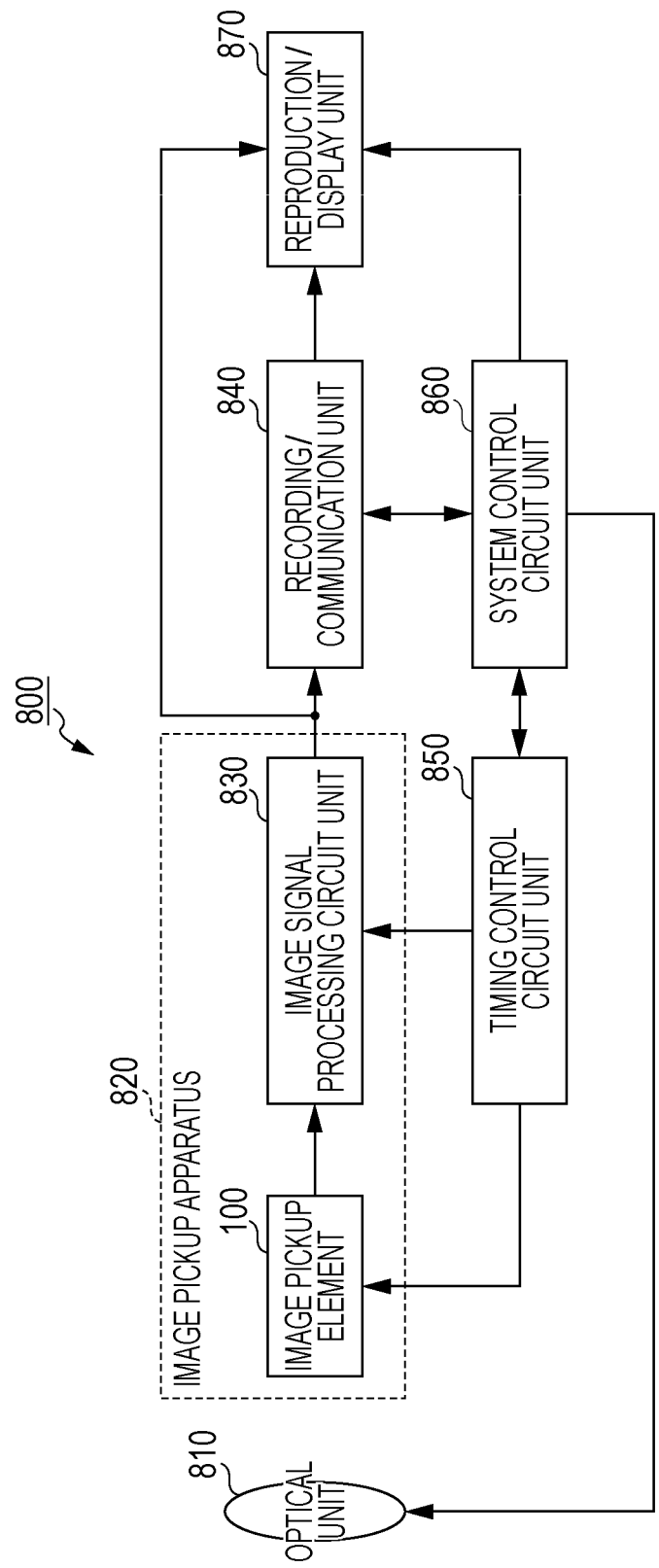
FIG. 10 is a diagram illustrating a configuration of an image pickup system according to a second exemplary embodiment.

FIG. 10 is a diagram illustrating an exemplary configuration of an image pickup system according to a second exemplary embodiment. An image pickup system 800 includes, for example, an optical unit 810, the image pickup element 100, the image signal processing circuit unit 830, a recording/communication unit 840, a timing control circuit unit 850, a system control circuit unit 860, and a reproduction/display unit 870. The image pickup element 100 and the image signal processing circuit unit 830 constitute an image pickup apparatus 820. As the image pickup element 100, the image pickup element 100 described in the first exemplary embodiment is used.

The optical unit 810, which includes an optical system, such as lenses, forms an image of a subject based on light reflected from the subject on the pixel unit 10 (FIG. 1) of the image pickup element 100 in which a plurality of pixels is two-dimensionally arranged. The image pickup element 100 outputs a signal corresponding to the optical image formed on the pixel unit 10 at a timing based on a signal supplied from the timing control circuit unit 850. The signal output from the image pickup element 100 is input to the image signal processing circuit unit 830, which is an image signal processing unit. The image signal processing circuit unit 830 performs signal processing in accordance with a method determined by a program or the like. The image signal processing circuit unit 830 may perform signal processing, such as bit shift/subtraction described in FIGS. 3A to 3C, on the input signal. The signal obtained through the processing performed by the image signal processing circuit unit 830 is sent to the recording/communication unit 840 as image data. The recording/communication unit 840 sends a signal used to form an image to the reproduction/display unit 870. The reproduction/display unit 870 reproduces and displays movie or still images. The recording/communication unit 840 also performs communication with the system control circuit unit 860 after receiving a signal from the image signal processing circuit unit 830 and performs an operation of recording a signal used to form an image on a recording medium, not illustrated.

The system control circuit unit 860 controls the operations of the image pickup system 800 in an integrated fashion, and controls driving of the optical unit 810, the timing control circuit unit 850, the recording/communication unit 840, and the reproduction/display unit 870. The system control circuit unit 860 also includes a storage device (not illustrated), for example, a recording medium. The storage device stores programs necessary for controlling the operations of the image pickup system 800. Additionally, the system control circuit unit 860 supplies a signal for switching the driving mode in accordance with a user operation within the image pickup system 800, for example. Specific examples of the signal include a signal for changing a row to be read or a row to be reset, a signal for changing the angle of view in response to electronic zooming, and a signal for shifting the angle of view in response to electronic image stabilizing. The timing control circuit unit 850 controls timings of driving the image pickup element 100 and the image signal processing circuit unit 830 under control of the system control circuit unit 860.

As described above, according to the first and second exemplary embodiments, the base signal of a pixel is compared with the high-resolution base-signal ramp signal VR regardless of whether the effective signal of the pixel is a high-amplitude signal or a low-amplitude signal. After the level of the effective signal is determined, the ramp signal VH or VL suitable for the determined signal level is selected. AD conversion data is obtained by performing subtraction in which the ratio between resolutions of the effective signal and the base signal is corrected. In this way, a high precision and an increase in the number of bits may be achieved.

In a dark image pickup environment, the pixel signal is likely to be a low-amplitude signal depending on an exposure condition and the speed rating may be increased by amplifying the pixel signal. In the first exemplary embodiment, the amplifier circuit 20-1 may amplify the signal to increase the speed rating. When the signal is input from the pixel unit 10 to the comparator circuit 30-1 without being amplified, the speed rating may be increased by changing the slopes of the ramp signals. In the first and second exemplary embodiments, the slopes of the ramp signals are not uniquely determined but the slopes of the ramp signals may be changed in accordance with a desired increase in the speed rating. For example, when the speed rating is doubled, the slopes of the ramp signals may be controlled to be ½.

In the first and second exemplary embodiments described above, ramp signals that continuously change with respect to time are used as reference signals but signals of another type, such as reference signals that change stepwise, may be used.

Each of the exemplary embodiments described above is merely an example for carrying out the disclosure and the technical scope of the disclosure should not be limited by these exemplary embodiments. That is, the disclosure may be carried out in various forms without departing from the technical spirit or major features thereof. For example, although ramp signals whose levels linearly change with respect to time are described as reference signals, signals whose levels change stepwise may be used.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-082374 filed Mar. 30, 2012 and No. 2013-006147 filed Jan. 17, 2013, which are hereby incorporated by reference herein in their entirety.

What is claimed is:

1. A photoelectric conversion apparatus comprising:
a plurality of pixels provided in a plurality of columns;
a reference signal generating unit configured to generate a first reference signal and a second reference signal, the first reference signal having a first changing rate with respect to time, and the second reference signal having a second changing rate with respect to time, wherein the first changing rate is smaller than the second changing rate;
a plurality of analog-to-digital conversion units each provided for a corresponding one of the plurality of columns, each of the plurality of analog-to-digital conversion units being configured to convert a signal output from a corresponding pixel of the plurality of pixels into a digital signal by comparing the signal and one of the first reference signal and the second reference signal; and
a correction unit configured to correct the digital signal based on an error in comparison to an ideal ratio of the first changing rate and the second changing rate.

2. The photoelectric conversion apparatus according to claim 1,
wherein the signal output from the pixel includes a signal obtained through photoelectric conversion,
wherein the analog-to-digital conversion unit compares a comparison level and a level of the signal output from the pixel,
wherein a result of the comparison by the analog-to-digital conversion unit indicates that the level of the signal output from the pixel is smaller than the comparison level, the analog-to-digital conversion unit compares the signal output from the pixel and the first reference signal, and
wherein a result of the comparison by the analog-to-digital conversion unit indicates that the level of the signal output from the pixel is larger than the comparison level, the analog-to-digital conversion unit compares the signal output from the pixel and the second reference signal.

3. The photoelectric conversion apparatus according to claim 1, further comprising
a base signal generation unit configured to output a base signal,
wherein the correction unit corrects the digital signal based on the signal output from the pixel, in accordance with respective digital signals obtained by comparing the base signal and the first reference signal, and comparing the base signal and the second reference signal.

4. The photoelectric conversion apparatus according to claim 1,
wherein each of the plurality of analog-to-digital conversion units includes a counter, and
wherein the counter serves as the correction unit.

5. An image pickup system comprising:
the photoelectric conversion apparatus according to claim 1; and
a signal processing unit that processes a signal output from the photoelectric conversion apparatus.

6. The photoelectric conversion apparatus according to claim 2,
wherein a changing ratio of a reference signal is selected from among two or more values, and
wherein a period over which the reference signal changes is longer when a larger slope is selected from among the two or more values.

7. The photoelectric conversion apparatus according to claim 6,
wherein the signal output from the pixel further includes a base signal, and
wherein each of the plurality of analog-to-digital conversion units converts the base signal into a digital signal and thereafter converts the signal obtained through photoelectric conversion into a digital signal.

8. The photoelectric conversion apparatus according to claim 1, further comprising an image signal processing circuit unit configured to calculate the error using a digital signal obtained by converting a first analog signal by the first reference signal, and a digital signal obtained by converting a second analog signal, which has a same signal value as the first analog signal, by the second reference signal, and to output the error to the correction unit.

9. A photoelectric conversion apparatus according to claim 1, wherein the ideal ratio is a ratio of the second changing rate to the first changing rate, and the ratio is 2 to $n^{th}$ power (where "n" is a natural number of 1 or more).

10. A photoelectric conversion apparatus comprising:
a plurality of pixels provided in a plurality of columns;
a plurality of analog-to-digital conversion units each provided for a corresponding one of the plurality of columns, each of the plurality of analog-to-digital conversion units being configured to convert a signal output from a corresponding pixel of the plurality of pixels into a digital signal at a resolution corresponding to a magnitude of the signal; and
a correction unit configured to correct the digital signals generated by different resolutions between the plurality of analog-to-digital conversion units based on an error in comparison to an ideal ratio of the different resolutions,
wherein each of the plurality of analog-to-digital conversion units generates the digital signal in accordance with a reference signal that changes with respect to time,
wherein the resolution is determined in accordance with a rate of change of the reference signal with respect to time,
wherein the signal output from the pixel includes a signal obtained through photoelectric conversion,
wherein each of the plurality of analog-to-digital conversion units determines a slope of the reference signal used for the signal obtained through photoelectric conversion, in accordance with a result of comparing a level of the signal obtained through photoelectric conversion with a comparison level,
wherein the slope of the reference signal is selected from among two or more values, and
wherein a period over which the reference signal changes is longer when a larger slope is selected from among the two or more values.

11. The photoelectric conversion apparatus according to claim 10,
wherein the signal output from the pixel further includes a base signal, and
wherein each of the plurality of analog-to-digital conversion units converts the base signal into a digital signal and thereafter converts the signal obtained through photoelectric conversion into a digital signal.

12. The photoelectric conversion apparatus according to claim 10, further comprising an image signal processing circuit unit configured to calculate the error using a digital signal obtained by converting a first analog signal by the first reference signal, and a digital signal obtained by converting a second analog signal, which has a same signal value as the first analog signal, by the second reference signal, and to output the error to the correction unit.

13. A photoelectric conversion apparatus according to claim 10, wherein the ideal ratio of the different resolutions is a ratio of a first rate of change of the reference signal with respect to time to a second rate of change of the reference signal with respect to time, and the ratio is 2 to $n^{th}$ power (where "n" is a natural number of 1 or more).

* * * * *